(12) United States Patent
Kato (10) Patent No.: US 7,852,897 B2
(45) Date of Patent: Dec. 14, 2010

(54) SEMICONDUCTOR LASER OPTICAL INTEGRATED SEMICONDUCTOR DEVICE

(75) Inventor: Takashi Kato, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 85 days.

(21) Appl. No.: 12/320,650

(22) Filed: Jan. 30, 2009

(65) Prior Publication Data

US 2009/0201964 A1    Aug. 13, 2009

(30) Foreign Application Priority Data

Feb. 7, 2008    (JP) .............................. 2008-027970

(51) Int. Cl.
*H01S 5/00* (2006.01)
*H01S 3/00* (2006.01)
*H01S 3/08* (2006.01)

(52) U.S. Cl. .............................. 372/50.121; 372/50.12; 372/46.01; 372/38.01; 372/96

(58) Field of Classification Search ............ 372/50.121, 372/50.12, 46.01, 38.01, 96
See application file for complete search history.

(56) References Cited

U.S. PATENT DOCUMENTS

| | | | | |
|---|---|---|---|---|
| 5,642,371 | A * | 6/1997 | Tohyama et al. | 372/45.01 |
| 6,108,362 | A * | 8/2000 | Adams et al. | 372/50.1 |
| 2004/0119079 | A1* | 6/2004 | Hayakawa et al. | 257/80 |
| 2006/0050752 | A1* | 3/2006 | Nunoya et al. | 372/43.01 |

OTHER PUBLICATIONS

"Wavelength Tunable DFB LD with High Coupling Coefficient Gratings", written by Nobuhiro Nunoya et al., The collected papers of The Institute of Electronics, Information and Communication Engineers (IEICE) General Conference, C 420, p. 282, 2007 and English translations.

"Wavelength Tunable DFB LD with High Coupling Coefficient Gratings", written by Nobuhiro Nunoya et al., The collected papers of The Institute of Electronics, Information and Communication Engineers (IEICE) General Conference, C 420, p. 282, 2007, Mar. 20, 2007and English translations.

* cited by examiner

*Primary Examiner*—Minsun Harvey
*Assistant Examiner*—Patrick Stafford
(74) *Attorney, Agent, or Firm*—Smith, Gambrell & Russell, LLP

(57) ABSTRACT

A semiconductor laser is a distributed feedback semiconductor laser in which the lasing wavelength can be changed, and includes a semiconductor substrate and a semiconductor layer portion provided on the substrate and including first and second active layers and an intermediate layer that optically couples the first active layer and the second active layer. The first active layer, the intermediate layer, and the second active layer are arranged in that order in a predetermined axis direction. The semiconductor laser further includes a diffraction grating that is optically coupled with the first and second active layers of the semiconductor layer portion, a first electrode and a second electrode for injecting carriers into the first active layer and the second active layer, respectively, and a third electrode for supplying the intermediate layer with a current. The grating extends in the predetermined axis direction and has a period that is uniform in the predetermined axis direction.

11 Claims, 7 Drawing Sheets

SEMICONDUCTOR LASER OPTICAL INTEGRATED SEMICONDUCTOR DEVICE

BACKGROUND OF THE INVENTION

1. Field of the Invention

The present invention relates to a distributed feedback (DFB) semiconductor laser and an optical integrated semiconductor device.

2. Description of the Related Art

A known semiconductor laser is described in "Wavelength Tunable DFB LD with High Coupling Coefficient Gratings" written by Nobuhiro Nunoya et al., The collected papers of The Institute of Electronics, Information and Communication Engineers (IEICE) General Conference, C-4-20, p. 282, 2007. This semiconductor laser includes two distributed feedback (DFB) regions having a grating, and a phase shift region. One of the DFB regions, the phase shift region, and the other DFB region are arranged in that order in the optical axis direction of this semiconductor laser. In this DFB laser structure, the two DFB regions sandwich the phase shift region. These DFB regions and the phase shift region are optically coupled. When a distributed feedback operation is performed in the two DFB regions, the lasing wavelength can be changed within a stopband of the grating formed in the DFB regions by injecting a current into the phase shift region. The principle through which the lasing wavelength is changed will now be described in the following. In the semiconductor laser having the above structure, when a current is injected into the phase shift region through an electrode for wavelength tuning provided in the phase shift region, the refractive index of the phase shift region changes. As a result, the optical length of the phase shift region changes. Accordingly, when the amount of phase shift is adjusted by changing the current injected into the phase shift region, the lasing wavelength changes within the stopband.

SUMMARY OF THE INVENTION

In the grating formed in the above-described DFB regions, the lasing wavelength may discontinuously change (i.e., mode hopping may occur) depending on the initial phase of the grating. The initial phase of the grating is determined by the shape of an end of the grating, the end being adjacent to the phase shift region and the end facet of the DFB laser.

Accordingly, it is an object of the present invention to provide a semiconductor laser and optical integrated semiconductor device in which the lasing wavelength can be continuously changed while suppressing mode hopping more reliably.

A semiconductor laser according to the present invention is a distributed feedback semiconductor laser in which the lasing wavelength can be changed, and includes a semiconductor substrate and a semiconductor layer portion provided on the semiconductor substrate and including a first active layer, a second active layer, and an intermediate layer that optically couples the first active layer and the second active layer. The first active layer, the intermediate layer, and the second active layer, all of which are included in the semiconductor layer portion, are arranged in that order in a predetermined axis direction. The semiconductor laser according to the present invention further includes a diffraction grating that is optically coupled with the first active layer and the second active layer of the semiconductor layer portion, a first electrode for injecting carriers into the first active layer, a second electrode for injecting carriers into the second active layer, and a third electrode for supplying the intermediate layer with a signal for wavelength tuning, wherein the diffraction grating extends in the predetermined axis direction, and a period of the diffraction grating is uniform in the predetermined axis direction.

When this semiconductor laser is driven by injecting carriers from the first and second electrodes to the first and second active layers, respectively, a current is injected into the intermediate layer through the third electrode. The refractive index of the intermediate layer is changed by the current injection into the intermediate layer, and thus a phase-shift effect can be achieved. As a result, by adjusting the amount of current injected into the intermediate layer, the lasing wavelength can be continuously changed within a stopband of the grating.

In the above structure, the grating is provided over the entire length of the semiconductor layer portion. The grating has a period that is uniform in the predetermined axis direction and extends in the predetermined axis direction. More specifically, the grating is continuously provided on the first active layer, the intermediate layer, and the second active layer. Therefore, an end of the grating is not present at boundary portions between the first active layer and the intermediate layer and between the intermediate layer and the second active layer. Accordingly, mode hopping due to the initial phase, which is determined by the shape of the end, does not occur. In the semiconductor laser according to the present invention, the lasing wavelength can be changed while suppressing mode hopping more reliably.

The first active layer and the second active layer are preferably made of the same semiconductor material. According to an embodiment of the present invention, the grating may be provided on the semiconductor layer portion.

Alternatively, the grating may be provided on the semiconductor substrate, and the semiconductor layer portion may be provided on the grating.

A coupling coefficient of the grating is preferably 100 cm$^{-1}$ or more. When the coupling coefficient is within this range, the tuning range of the lasing wavelength can be 3 nm or more.

The third electrode is preferably disposed in a central portion of the semiconductor laser in the predetermined axis direction. This structure can allow laser oscillation at a lower threshold.

Furthermore, a length of the third electrode in the predetermined axis direction is preferably 1/10 or less of a length of the semiconductor laser in the predetermined axis direction. In this case, the phase-shift effect in the intermediate layer can be more reliably achieved. In addition, by using this structure, a stable operation having a single wavelength can be more reliably achieved.

The bandgap energy of the intermediate layer may be larger than the bandgap energy of the first active layer and the second active layer.

In the semiconductor laser according to the present invention, the grating may include a periodic corrugation provided at an interface between an optical confinement layer provided on the semiconductor layer portion and a cladding layer provided on the optical confinement layer. In this case, the optical confinement layer is made of a semiconductor material having a bandgap energy larger than the bandgap energy of the first active layer and the second active layer. Since the refractive index of the optical confinement layer is different from the refractive index of the cladding layer, the distribution of the refractive index is periodically changed in the grating. Light of a specific wavelength determined by the period of the grating is selectively reflected by this grating structure.

In the semiconductor laser according to the present invention, the grating may include a periodic corrugation provided at an interface between the semiconductor substrate and an optical confinement layer provided on the semiconductor substrate. In this case, the optical confinement layer is made of a semiconductor material having a bandgap energy larger than the bandgap energy of the first active layer and the second active layer. Since the refractive index of the optical confinement layer is different from the refractive index of the semiconductor substrate, the distribution of the refractive index is periodically changed in the grating. Light of a specific wavelength determined by the period of the grating is selectively reflected by this grating structure.

An optical integrated semiconductor device according to the present invention includes a plurality of semiconductor lasers, a semiconductor optical combining portion that is optically coupled with the semiconductor lasers and that combines laser beams output from the semiconductor lasers to output a combined laser beam, and a semiconductor optical amplifier portion that is optically coupled with the semiconductor optical combining portion and that optically amplifies the optical output from the semiconductor optical combining portion to output an amplified laser beam. Each of the semiconductor lasers is a distributed feedback semiconductor laser in which the lasing wavelength can be changed, and includes a semiconductor substrate and a semiconductor layer portion provided on the semiconductor substrate and including a first active layer, a second active layer, and an intermediate layer that optically couples the first active layer and the second active layer. The first active layer, the intermediate layer, and the second active layer, all of which are included in the semiconductor layer portion, are arranged in that order in a predetermined axis direction. In addition, each of the semiconductor lasers includes a diffraction grating that is optically coupled with the first active layer and the second active layer of the semiconductor layer portion, a first electrode for injecting carriers into the first active layer, a second electrode for injecting carriers into the second active layer, and a third electrode for supplying the intermediate layer with a signal for wavelength tuning. The diffraction grating included in each of the semiconductor lasers extends in the predetermined axis direction, and a period of the diffraction grating is uniform in the predetermined axis direction. Periods of the diffraction gratings of the semiconductor lasers are different from each other, the semiconductor lasers are provided with a common substrate, and the semiconductor optical combining portion and the semiconductor optical amplifier portion are provided on the substrate.

In this optical integrated semiconductor device, laser beams is emitted from the semiconductor lasers pass through the semiconductor optical combining portion, and a combined laser beam is then optically amplified in the semiconductor optical amplifier portion, and an amplified beam is emitted to the outside. Each of the semiconductor lasers is the above-described semiconductor laser according to the present invention, and thus the lasing wavelength can be changed within the stopband of the grating without causing mode hopping. Since the periods of the gratings of the semiconductor lasers are different from each other, the wavelengths of light diffracted by the gratings are also different. As a result, the tuning ranges of the lasing wavelength of the semiconductor lasers are different. Accordingly, in the optical integrated semiconductor device, the wavelength of output light can be changed over a wide range compared with the case where a single semiconductor laser is provided. Furthermore, since the semiconductor lasers are provided with a common substrate and the semiconductor optical combining portion and the semiconductor optical amplifier portion are disposed on the substrate, the size of the optical integrated semiconductor device can be reduced.

The above object, another object, features, and advantages of the present invention will more easily become apparent from the following detailed description of preferred embodiments of the present invention with reference to the attached drawings.

DESCRIPTION OF THE PREFERRED EMBODIMENTS

Semiconductor lasers and an optical integrated semiconductor device according to embodiments of the present invention will now be described with reference to the attached drawings. In the description below, the same components are assigned the same reference numerals, and overlapping description of those components is omitted. The dimensional ratio in the drawings does not necessarily correspond to that in the description.

Figure 1:
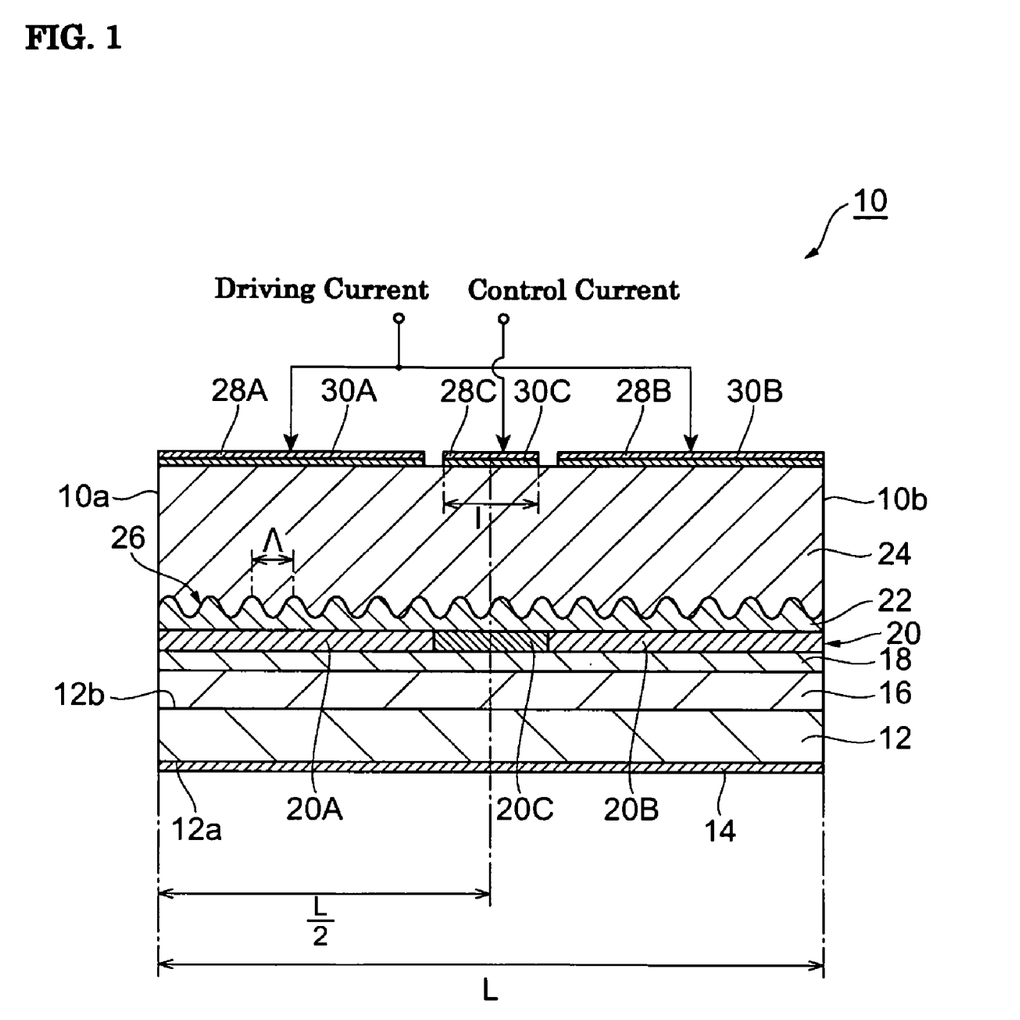
FIG. 1 is a cross-sectional view showing a semiconductor laser according to an embodiment of the present invention.

FIG. 1 is a cross-sectional view showing a semiconductor laser according to an embodiment of the present invention. FIG. 1 shows a cross-sectional structure in the optical axis direction of the semiconductor laser. A semiconductor laser 10 is a semiconductor optical device in which the lasing wavelength can be changed, and is suitably used in a wavelength division multiplexing (WDM) transmission system, a spectroscopy system, or the like.

The semiconductor laser 10 includes a semiconductor substrate 12 of a first conductivity type (for example, an n type). A lower surface electrode 14 is provided on a lower surface 12a of the semiconductor substrate 12. A cladding layer 16 of the first conductivity type, an optical confinement layer 18, a semiconductor layer portion 20, an optical confinement layer 22, and a cladding layer 24 of a second conductivity type (for example, a p type) are stacked on an upper surface 12b of the semiconductor substrate 12 in that order.

The semiconductor layer portion 20 includes a first active layer 20A, a second active layer 20B, and a wavelength-tuning layer (intermediate layer) 20C. The first active layer 20A, the wavelength-tuning layer 20C, and the second active layer 20B are arranged in that order in the optical axis direction (a predetermined axis direction) of the semiconductor laser 10 and optically coupled with each other. The first active layer 20A and the second active layer 20B are made of a semiconductor material from which an optical gain can be obtained by carrier injection. On the other hand, the wavelength tuning layer 20C is made of a semiconductor material that does not have a positive gain at the wavelength of light generated in the first active layer 20A and the second active layer 20B. More specifically, the wavelength tuning layer 20C is made of a semiconductor material having a bandgap energy larger than the bandgap energy of the semiconductor material constituting the first active layer 20A and the second active layer 20B.

The optical confinement layer 22 is provided on the semiconductor layer portion 20 including the first active layer 20A, the second active layer 20B, and the wavelength-tuning layer (intermediate layer) 20C. The optical confinement layer 22 has a periodic corrugation on the upper surface thereof The cladding layer 24 having a refractive index different from the refractive index of the optical confinement layer 22 is provided on the optical confinement layer 22. Accordingly, the semiconductor laser 10 includes a diffraction grating 26 in which the distribution of the refractive index is periodically changed.

The grating 26 extends over the entire length of the semiconductor laser 10 in the optical axis direction of the semiconductor laser 10. A period Λ of the grating 26 in the optical axis direction is uniform. In the grating 26, grating portions located on the first active layer 20A and the second active layer 20B are optically coupled with the first active layer 20A and the second active layer 20B, respectively, and function as grating portions having a function of distributed feedback.

Carriers to the first active layer 20A and the second active layer 20B is supplied from a first electrode 28A and a second electrode 28B, respectively. And a current for wavelength tuning (or an electrical signal for wavelength tuning) is supplied to the wavelength-tuning layer 20C from a third electrode 28C. The first electrode 28A, the second electrode 28B and the third electrode 28C are provided on the upper surface of the cladding layer 24. As shown in FIG. 1, the first electrode 28A, the second electrode 28B, and the third electrode 28C can be provided on the surface of the cladding layer 24 with a contact layer 30A, a contact layer 30B, and a contact layer 30C, respectively, therebetween.

The structure of the semiconductor laser 10 will now be described in more detail on the basis of a case where a substrate made of n-type InP is used as the semiconductor substrate 12.

In the case where a substrate made of n-type InP is used as the semiconductor substrate 12, the cladding layer 16 is also made of n-type InP. The thickness of the cladding layer 16 is, for example, in the range of 0.2 to 2 µm. The doping concentration of the cladding layer 16 is, for example, in the range of $1 \times 10^{17}$ to $1 \times 10^{18}$ cm$^{-3}$.

The optical confinement layer 18 is made of undoped GaInAsP or AlGaInAs. The optical confinement layer 18 is made of a semiconductor material having a bandgap energy larger than the bandgap energy of the semiconductor material constituting the first active layer 20A and the second active layer 20B. The thickness of the optical confinement layer 18 is, for example, in the range of 0.02 to 0.5 µm. The semiconductor material constituting the optical confinement layer 18 has, for example, a bandgap energy of 0.99 eV or a bandgap wavelength of 1.25 µm. Here, the bandgap energy Eg (eV) and the bandgap wavelength λg (µm) have the relationship of λg=1.24/Eg.

The first active layer 20A and the second active layer 20B of the semiconductor layer portion 20 are made of the same semiconductor material and include a multi-quantum well structure of an undoped GaInAsP mixed-crystal system or a multi-quantum well structure of an undoped AlGaInAs mixed-crystal system. The wavelength of light emitted from the first active layer 20A and the second active layer 20B is 1.55 µm. The wavelength-tuning layer 20C of the semiconductor layer portion 20 can be made of undoped InP. GaInAsP or AlGaInAs having a bandgap energy larger than the bandgap energy of the first active layer 20A and the second active layer 20B can be also used for the wavelength-tuning layer 20C. The semiconductor material constituting the wavelength-tuning layer 20C has, for example, a bandgap energy of 0.89 eV or a bandgap wavelength of 1.4 µm. The thickness of each of the first active layer 20A, the second active layer 20B, and the wavelength-tuning layer 20C, i.e., the thickness of the semiconductor layer portion 20 is, for example, in the range of 0.02 to 0.2 µm.

The optical confinement layer 22 is made of the same material as the material of the optical confinement layer 18. The optical confinement layer 22 is made of a semiconductor material having a bandgap energy larger than the bandgap energy of the semiconductor material constituting the first active layer 20A and the second active layer 20B. The semiconductor material constituting the optical confinement layer 22 has, for example, a bandgap energy of 0.99 eV or a bandgap wavelength of 1.25 µm. The period Λ of the grating 26 composed of the periodic corrugation formed on the surface of the optical confinement layer 22 is preferably determined so that a diffraction wavelength corresponds to an emission wavelength from the semiconductor laser in a band ranging from 1.28 to 1.65 µm. A typical example of the diffraction wavelength is 1.55 µm. An example of a coupling coefficient κ of the grating 26 is in the range of 100 to 600 cm$^{-1}$. The coupling coefficient κ can be controlled by changing the depth of the grating 26. For example, when the coupling coefficient κ is 100 cm$^{-1}$, the depth of the grating 26 is about 100 nm.

The cladding layer 24 disposed on the optical confinement layer 22 is made of p-type InP. The doping concentration of the cladding layer 24 is, for example, in the range of $1 \times 10^{17}$ to $1 \times 10^{18}$ cm$^{-3}$.

The contact layers 30A to 30C provided so as to correspond to the first to third electrodes 28A to 28C, respectively, are made of p-type GaInAs. The doping concentration of the contact layers 30A to 30C is, for example, in the range of $1 \times 10^{18}$ to $1 \times 10^{20}$ cm$^{-3}$. As shown in FIG. 1, the first to third electrodes 28A to 28C are electrically separated by grooves, and no contact layers 30A to 30C are provided between the electrodes.

The entire length L of the semiconductor laser 10 in the optical axis direction is, for example, in the range of 100 to 1,200 µm. As described below, the third electrode 28C or the wavelength-tuning layer 20C is preferably arranged so that the center thereof is located in a central portion of the semiconductor laser 10, i.e., at a position L/2 distant from an end face 10a of the semiconductor laser 10. In addition, the length l of the third electrode 28C in the optical axis direction is preferably about 1/10 of the entire length L of the semiconductor laser 10. For example, when the entire length L of the semiconductor laser 10 is 250 µm, the length l of the third electrode 28C is 10 µm.

The above-described semiconductor laser 10 can be produced, for example, as follows. First, the cladding layer 16 and the optical confinement layer 18 are sequentially grown on the upper surface 12b of the semiconductor substrate 12. Subsequently, the first active layer 20A, the second active layer 20B, and the wavelength-tuning layer 20C are grown on predetermined regions on the optical confinement layer 18 to form the semiconductor layer portion 20. In this step, either the first and second active layers 20A and 20B or the wavelength-length-tuning layer 20C may be grown in advance. Subsequently, the optical confinement layer 22 is grown on the semiconductor layer portion 20. The periodic corrugation is then formed on the surface of the optical confinement layer 22 by using a dry etching process or the like to form the grating 26. Subsequently, the cladding layer 24 is grown, and the contact layers 30A to 30C and the first to third electrodes 28A to 28C are then formed on predetermined positions of the cladding layer 24. In addition, the electrode 14 is formed on the lower surface 12a of the semiconductor substrate 12. Accordingly, the semiconductor laser 10 can be obtained.

In the semiconductor laser 10, a direct current (DC) for driving the semiconductor laser 10 is supplied to the first active layer 20A and the second active layer 20B through the first electrode 28A and the second electrode 28B, respectively, so that the first active layer 20A and the second active layer 20B emit light. Since the first active layer 20A and the second active layer 20B are optically coupled with the grating 26, a distributed feedback operation can be realized. That is, light having a wavelength in a reflection wavelength band (stopband) of the grating 26 contributes to laser oscillation.

When the semiconductor laser 10 shown in FIG. 1 is operated, a current for wavelength tuning is injected into the wavelength-tuning layer 20C through the third electrode 28C. The wavelength-tuning layer 20C is an intermediate layer provided between the first active layer 20A and the second active layer 20B. By injecting the tuning current into the wavelength-tuning layer 20C, a lasing wavelength within the stopband of the grating 26 can be selected. When the current is injected into the wavelength-tuning layer 20C, the refractive index of the wavelength-tuning layer 20C is changed by a plasma effect in accordance with the amount of current injected. As a result, the optical length in the wavelength-tuning layer 20C is changed, and thus the phase of light that is subjected to a distributed feedback by the grating can be shifted. Thereby, the lasing wavelength can be selected from the wavelength band within the stopband. That is, in the semiconductor laser 10, the lasing wavelength can be changed within the stopband by controlling the amount of current injected into the wavelength-tuning layer 20C.

Figure 2:
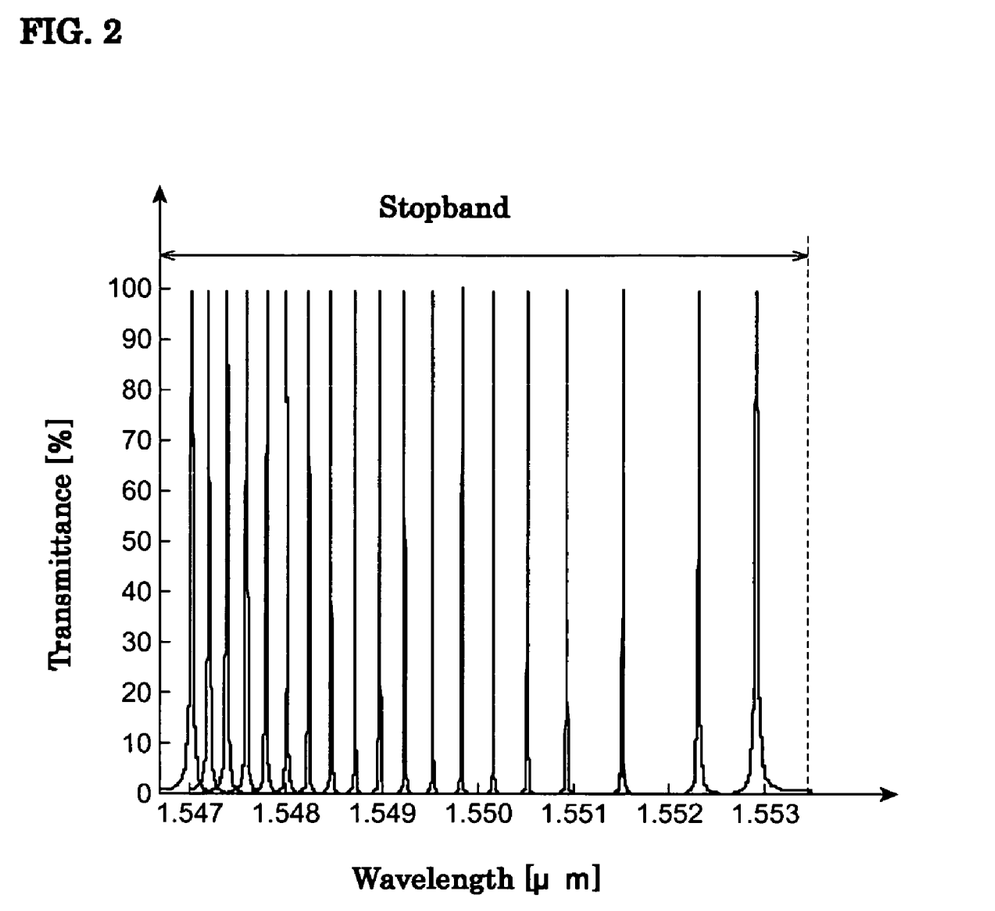
FIG. 2 is a graph showing simulation results of characteristics of a semiconductor laser.

FIG. 2 is a graph showing simulation results of lasing characteristics of a semiconductor laser. The vertical axis represents the transmittance. The term "transmit" means that light generated in the first active layer 20A and the second active layer 20B can exist with interference caused by the grating 26 provided above the first active layer 20A, the second active layer 20B, and the wavelength-tuning layer 20C; that is, the light can be transmitted through the first active layer 20A, the wavelength-tuning layer 20C, and the second active layer 20B in the optical axis direction. Laser oscillation occurs for light having a wavelength with a high transmittance. The horizontal axis represents the wavelength.

In the simulation, the entire length L of the semiconductor laser 10 is 250 μm. The coupling coefficient κ of the grating 26 is 320 cm$^{-1}$, and the center wavelength of a diffraction wavelength of the grating 26 (i.e., the center wavelength of the stopband) is 1.55 μm. In this case, the wavelength bandwidth of the stopband of the grating 26 is about 7 nm. Furthermore, the length l of the third electrode 28C in the optical axis direction is 10 μm. The third electrode 28C is arranged at the central position of the semiconductor laser 10 in the optical axis direction, i.e., at a position L/2 distant from the end face 10a. The length of the wavelength-tuning layer 20C in the optical axis direction is substantially the same as the length l of the third electrode 28C.

In the simulation, the value of the current injected from the third electrode 28C is changed in the range of 0.5 mA, 1 mA, 2 mA, . . . 17 mA, and 18 mA. In FIG. 2, the peak wavelengths of the transmittance that sequentially appear from the long-wavelength side correspond to the transmission wavelength (or the lasing wavelength) in the case where the current value is sequentially changed as described above. As shown in FIG. 2, the transmission wavelength, i.e., the lasing wavelength is changed within the stopband of the grating 26 by changing the value of the current injected. That is, in the semiconductor laser 10, the lasing wavelength can be changed by changing the amount of current for wavelength tuning supplied to the wavelength-tuning layer 20C.

Figure 3:
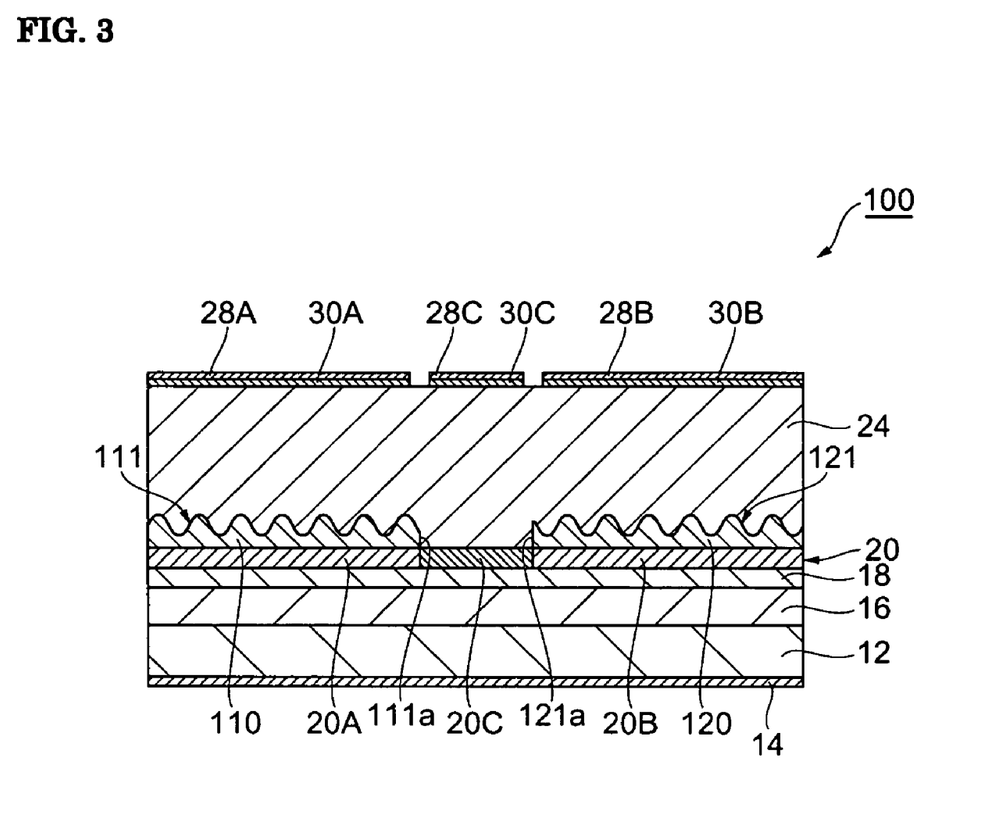
FIG. 3 is a cross-sectional view showing an example of the structure of a comparative semiconductor laser.

Here, the operation and the advantages of the semiconductor laser 10 will be specifically described by comparing with the conventional structure of a semiconductor laser in the related art shown in FIG. 3.

FIG. 3 shows an example of the structure of the comparative semiconductor laser. The structure of a semiconductor laser 100 shown in FIG. 3 differs from the structure of the semiconductor laser 10 shown in FIG. 1 in that a grating is not provided on the wavelength-tuning layer 20C. However, the other structure of the semiconductor laser 100 is the same as the structure of the semiconductor laser 10. Accordingly, common components are assigned the same reference numerals as those of the semiconductor laser 10, and overlapping description is omitted.

In the semiconductor laser 100, an optical confinement layer 110 having a diffraction grating 111 for a distributed feedback thereon is provided on the first active layer 20A, and an optical confinement layer 120 having a diffraction grating 121 for a distributed feedback thereon is provided on the second active layer 20B. A period of the grating 111 is the same as a period of the grating 121.

In the semiconductor laser 100, the grating 111 and the grating 121 are provided so as to correspond to the first active layer 20A and the second active layer 20B, respectively. When the initial phases of the gratings change, the phase of light to be fed back also shifts. The initial phases of the gratings are determined by the shapes of ends 111a and 121a of the gratings 111 and 121, respectively, the ends 111a and 121a being adjacent to the wavelength-tuning layer 20C. As a result, by variations in the initial phases at the ends of the gratings, the lasing wavelength may vary or the lasing wavelength may discontinuously change, i.e., mode hopping may occur.

In addition, since the period of each of the gratings 111 and 121 is as small as about 0.2 μm, it is technically difficult to form the shape of the ends 111a and the 121a in a reproducible manner. The initial phase of a grating is determined by the shape of an end of the grating. Accordingly, semiconductor lasers 100 having different lasing characteristics may be produced. In addition, it is difficult for the structure of the semiconductor laser 100 to suppress the occurrence of mode hopping.

Furthermore, in the case where the dimension of each of the first active layer 20A and the second active layer 20B in the optical axis direction is longer than the dimension of the wavelength-tuning layer 20C in the optical axis direction, in the semiconductor laser 100, it is believed that each of the portion including the first active layer 20A and the grating 111 and the portion including the second active layer 20B and the grating 121 oscillates as a DFB laser. In this case, different lasing wavelengths are emitted from each portion, and thus it is difficult to obtain a lasing wavelength of a single mode.

In contrast, in the semiconductor laser 10 shown in FIG. 1, the grating 26 is provided on the semiconductor layer portion 20, and the grating 26 is continuously provided between the end face 10a and an end face 10b of the semiconductor laser 10. Unlike the semiconductor laser 100, the ends 111a and 121a (see FIG. 3) are not present in this case, and thus the above-described variation in the lasing wavelength or mode hopping does not occur. In addition, since the grating 26 is continuously provided between the end face 10a and the end face 10b, the above-mentioned production error due to variations in the shapes of the ends also does not occur. As a result, the production yield of the semiconductor laser 10 having a superior lasing characteristic such as a continuous wavelength tuning and a non-mode-hopping also increases. Furthermore, in the semiconductor laser 10, a phenomenon in which a semiconductor stacked structure including the first active layer 20A and a semiconductor stacked structure including the second active layer 20B oscillate as separate DFB lasers does not occur. Accordingly, a laser beam having a desired wavelength can be stably output.

In addition, in the semiconductor laser 10, in the case where the bias current supplied to the first active layer 20A and the second active layer 20B is a direct current (DC) as described above; that is, the bias current is not modulated, for example, the coupling coefficient κ of the grating 26 can be increased. A large coupling coefficient κ widens the stopband, and thus the wavelength tuning range of the semiconductor laser 10 can be increased. Therefore, the semiconductor laser 10 can be suitably used in a WDM transmission system or the like.

In the semiconductor laser 10, the third electrode 28C is preferably disposed at the center of symmetry of a laser cavity, in other words, at the center of the semiconductor laser 10 in the optical axis direction. This is because this structure can efficiently output a laser beam.

Figure 4:
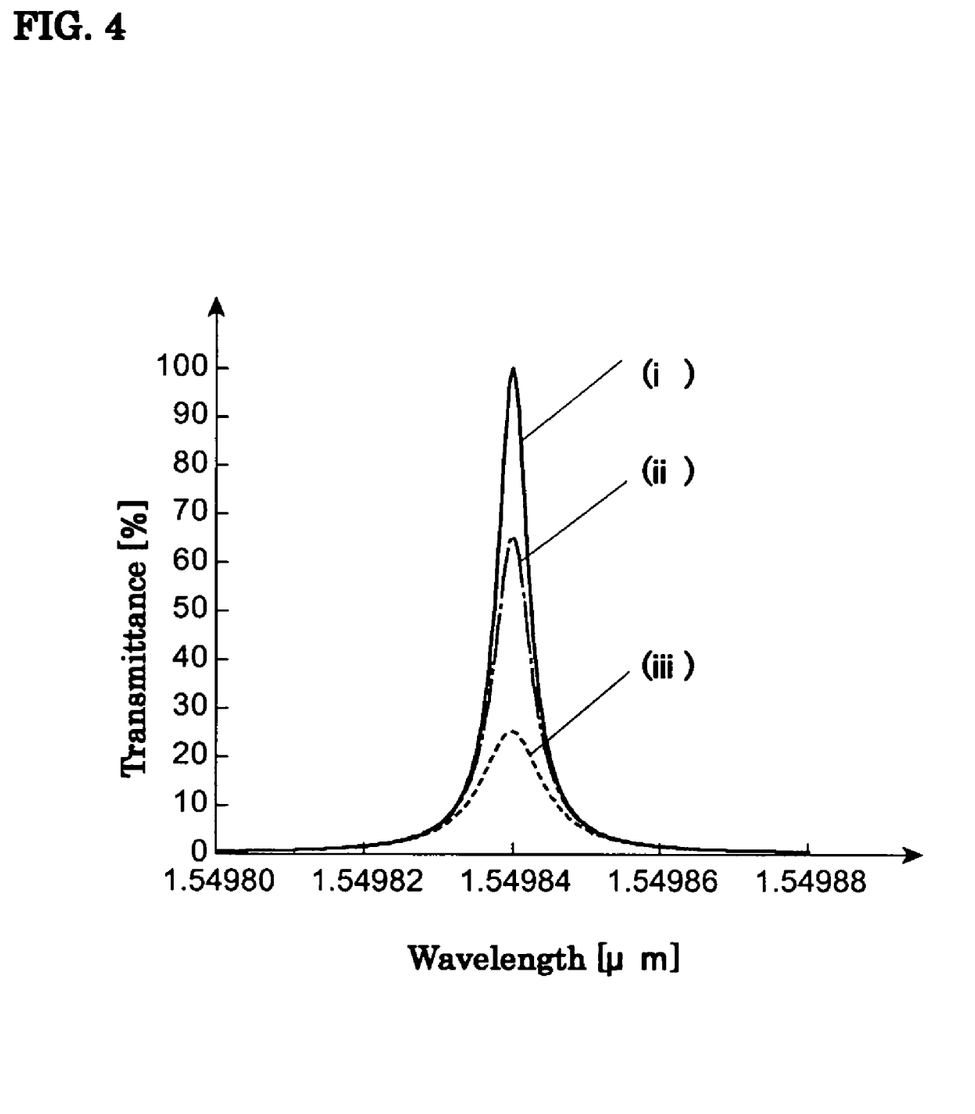
FIG. 4 is a graph showing simulation results in the case where the position of a third electrode is changed.

FIG. 4 is a graph showing simulation results in the case where the position of the third electrode is changed. FIG. 4 shows a change in the transmittance when a center position of the third electrode 28C is changed as follows:

(i) The spectrum shown by the solid line (line (i)) in the figure represents the case where the center position of the third electrode 28C is located in the center of the semiconductor laser 10, i.e., at a position L/2 distant from the end face 10a.
(ii) The spectrum shown by the one-dot chain line (line (ii)) in the figure represents the case where the center position of the third electrode 28C is shifted from the center of the semiconductor laser 10 by 10 μm.
(iii) The spectrum shown by the broken line (line (iii)) in the figure represents the case where the center position of the third electrode 28C is shifted from the center of the semiconductor laser 10 by 20 μm.

In FIG. 4, the current supplied from the third electrode 28C is fixed to 6 mA in the simulation for obtaining the simulation results shown in FIG. 2. Note that, in FIG. 4, the vicinity of a single transmission wavelength is enlarged.

As shown in FIG. 4, as the amount of shift of the third electrode 28C from the center of the semiconductor laser 10 increases, the transmittance tends to decrease. In this case, a threshold current of the semiconductor laser 10 increases, thereby decreasing the quantum efficiency of semiconductor laser. Accordingly, in order to decrease a threshold gain and to obtain a single mode oscillation, it is preferable that the third electrode 28C is arranged such that the center thereof is located in the center of the semiconductor laser 10 in the optical axis direction. By the way, the threshold gain is the gain which is necessary to obtain the laser oscillation at threshold. And a semiconductor laser having smaller threshold gain has a lower threshold current.

In addition, the length l of the third electrode 28C in the optical axis direction is preferably ⅒ or less of the entire length L of the semiconductor laser 10 in the optical axis direction because laser oscillation can be performed more reliably at a single wavelength. A specific description will be made in comparison with an example of a case where the above condition for the length l of the third electrode 28C is not satisfied.

Figure 5:
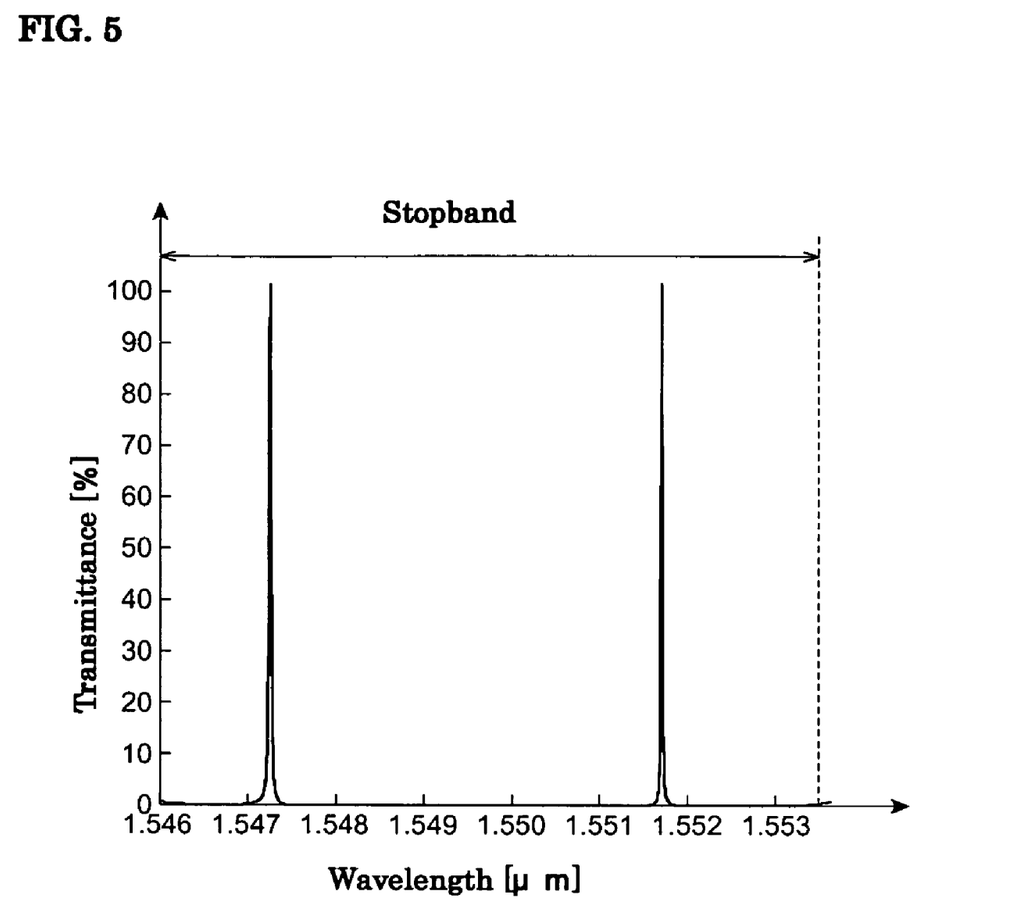
FIG. 5 is a graph showing a simulation result in the case where the length of the third electrode is larger than 1/10 of the length of a semiconductor laser in the optical axis direction.

FIG. 5 is a graph showing a simulation result in the case where the length of the third electrode is larger than ⅒ of the length of a semiconductor laser in the optical axis direction. The length l of the third electrode 28C is 30 μm, and the value of current supplied from the third electrode 28C is 15 mA. In this case, as shown in FIG. 5, two peaks are generated within the stopband for a single injection current. Accordingly, the semiconductor laser 10 does not oscillate at a single wavelength.

In contrast, under the condition of the simulation for obtaining the simulation results shown in FIG. 2, the entire length L of the semiconductor laser 10 is 250 μm and the length l of the third electrode 28C is 10 μm, which satisfies the above condition. In this case, as shown in FIG. 2, light having a single wavelength is transmitted even if the injection current supplied from the third electrode 28C changes, and thus laser oscillation can reliably occur at a single wavelength. Accordingly, the length l of the third electrode is preferably ⅒ or less of the entire length L of the semiconductor laser 10. In addition, by satisfying this condition, the peak wavelength within the stopband can be single, and thus laser oscillation can be performed at a single wavelength.

The semiconductor laser 10 described above can be suitably used in an optical integrated semiconductor device.

Figure 6:
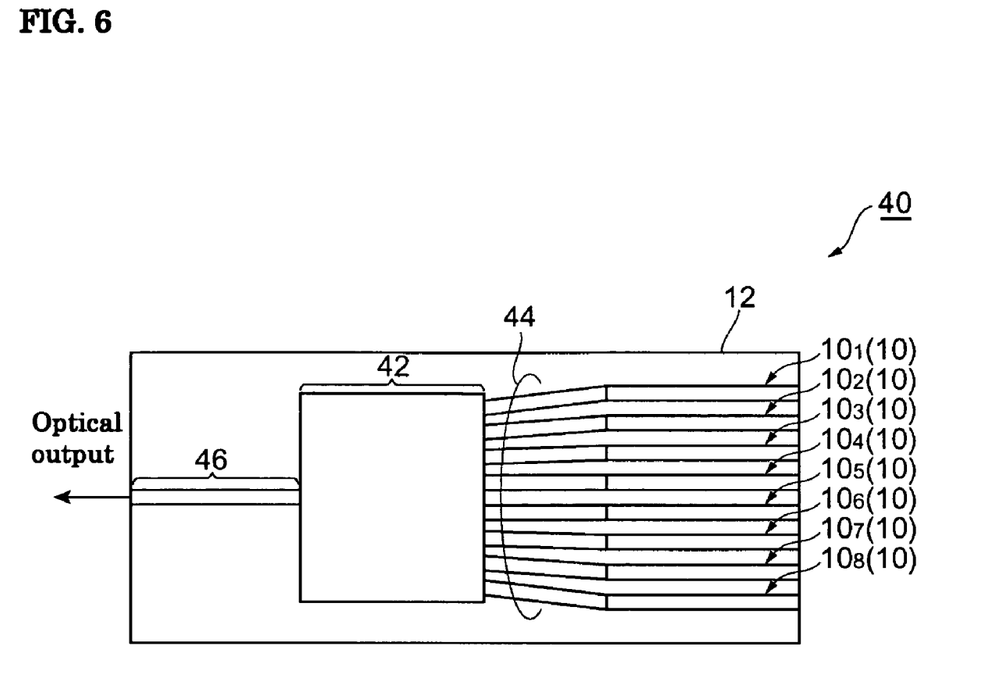
FIG. 6 is a plan view that schematically shows the structure of an optical integrated semiconductor device according to an embodiment of the present invention.

FIG. 6 is a plan view that schematically shows the structure of an embodiment of an optical integrated semiconductor device. FIG. 6 schematically shows components (such as semiconductor lasers 10 and a semiconductor optical combining portion described below) constituting the optical integrated semiconductor device. As shown in FIG. 6, an optical integrated semiconductor device 40 includes arrayed semiconductor lasers 10 each of which is shown in FIG. 1 and can be suitably used as an optical source in a wavelength division multiplexing (WDM) communication system.

The optical integrated semiconductor device 40 includes eight semiconductor lasers 10. Hereinafter, the eight semiconductor lasers 10 are also denoted by semiconductor lasers $10_1$, $10_2$, $10_3$, $10_4$, $10_5$, $10_6$, $10_7$, and $10_8$ for the sake of description. Accordingly, a similar notation may be used for components included in each of the semiconductor lasers $10_1$ to $10_8$.

The semiconductor lasers $10_1$ to $10_8$ are arranged in parallel and provided with a common semiconductor substrate 12. That is, the semiconductor stacked structures each including the semiconductor layer portion 20 and the first electrode 28A to the third electrode 28C, all of which are shown in FIG. 1, are provided on eight predetermined regions on the upper surface 12b of the semiconductor substrate 12. Periods $\Lambda_1$ to $\Lambda_8$ of the diffraction gratings $26_1$ to $26_8$ in the semiconductor lasers $10_1$ to $10_8$, respectively, are different. That is, diffraction wavelengths $\lambda_1$ to $\lambda_8$ of the gratings $26_1$ to $26_8$, respectively, are different. Accordingly, a laser beam can be output from each of the semiconductor lasers $10_1$ to $10_8$ by selecting a lasing wavelength from different stopbands.

In order to combine laser beams emitted from the semiconductor lasers $10_1$ to $10_8$, the optical integrated semiconductor device 40 includes a semiconductor optical combining portion 42. An example of the semiconductor optical combining portion 42 is a multi-mode interferometer (MMI). The semiconductor optical combining portion 42 is optically coupled with each of the semiconductor lasers $10_1$ to $10_8$ via a semiconductor optical waveguide 44.

In addition, in order to compensate for an insertion loss by fabricating the semiconductor optical combining portion 42 in the semiconductor optical waveguide 44, the optical integrated semiconductor device 40 further includes a semiconductor optical amplifier portion 46. The semiconductor optical amplifier portion 46 is optically coupled at the downstream of the semiconductor optical combining portion 42.

As shown in FIG. 6, the semiconductor optical combining portion 42, the semiconductor optical waveguides 44, and the semiconductor optical amplifier portion 46 are provided on the semiconductor substrate 12 including the semiconductor lasers $10_1$ to $10_8$. That is, semiconductor stacked structures constituting the semiconductor optical combining portion 42, the semiconductor optical waveguides 44, and the semiconductor optical amplifier portion 46 are provided on the upper surface 12b of the semiconductor substrate 12.

In the above structure, laser beams emitted from the semiconductor lasers $10_1$ to $10_8$ are input to the semiconductor optical combining portion 42 through the semiconductor optical waveguides 44. The input laser beams are combined by the semiconductor optical combining portion 42, and a combined laser beam is then optically amplified in the semiconductor optical amplifier portion 46. And an amplified laser beam is output from the optical integrated semiconductor device 40.

Each of the semiconductor lasers $10_1$ to $10_8$ has the similar structure as that of the semiconductor laser 10 shown in FIG. 1. Accordingly, the wavelengths of the laser beams emitted from the semiconductor lasers $10_1$ to $10_8$ can be changed within the stopbands of the corresponding gratings $26_1$ to $26_8$. Since the diffraction wavelengths $\lambda_1$ to $\lambda_8$ of the gratings $26_1$ to $26_8$ in the semiconductor lasers $10_1$ to $10_8$, respectively, are different, the stopbands of the gratings $26_1$ to $26_8$ are also different. As a result, the tuning ranges of the lasing wavelengths of the semiconductor lasers $10_1$ to $10_8$ are also different. Accordingly, in the optical integrated semiconductor device 40 in which the semiconductor lasers $10_1$ to $10_8$ are arrayed, the wavelength can be changed over a wider range.

Note that it is preferable that the stopbands of the gratings $26_1$ to $26_8$ in adjacent semiconductor lasers $10_1$ to $10_8$ partly overlap. Accordingly, the wavelength of light output from the optical integrated semiconductor device 40 can be continuously changed.

FIG. 6 shows an example in which the optical integrated semiconductor device 40 includes eight semiconductor lasers 10. However, the number of semiconductor lasers 10 is not particularly limited as long as the optical integrated semiconductor device 40 includes a plurality of semiconductor lasers 10.

Figure 7:
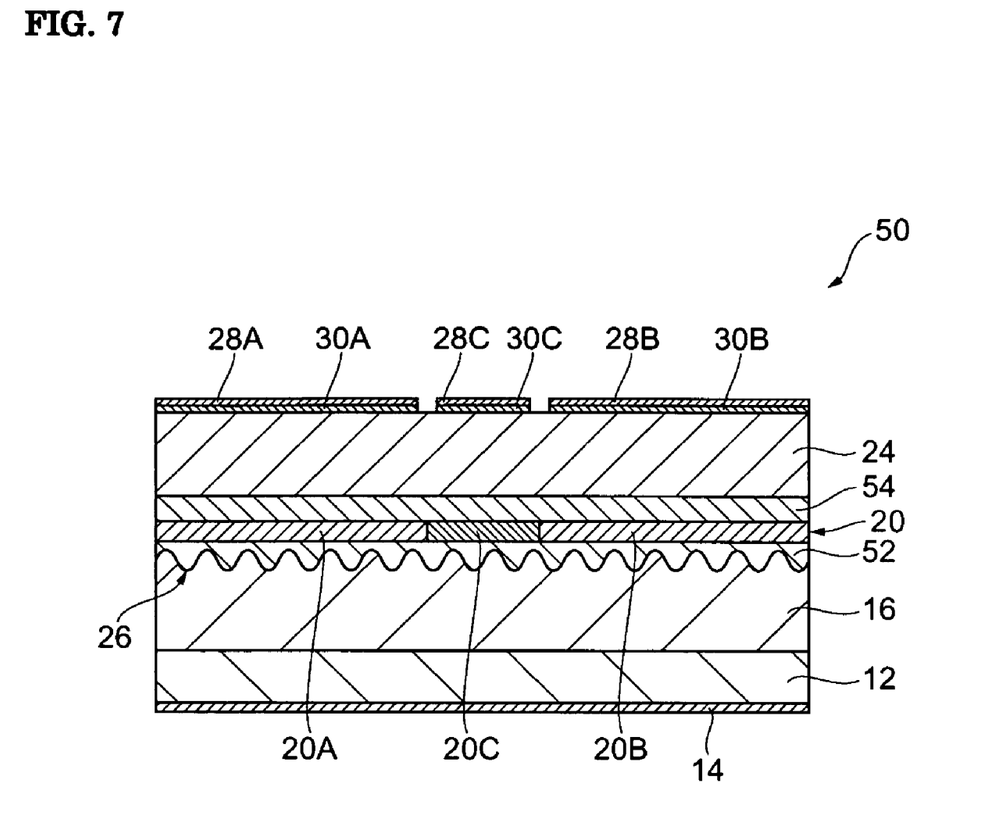
FIG. 7 is a cross-sectional view showing a semiconductor laser according to another embodiment of the present invention.

Embodiments of the present invention have been described, but the present invention is not limited to the above embodiments. For example, in the semiconductor laser 10 shown in FIG. 1, the grating 26 is provided at the side opposite the semiconductor substrate 12 with respect to the semiconductor layer portion 20. Alternatively, as shown in a semiconductor laser 50 shown in FIG. 7, a grating 26 may be provided at the semiconductor substrate 12 side with respect to a semiconductor layer portion 20. In producing the semiconductor laser 50 having such a structure, after a periodic corrugation is formed on a surface of a cladding layer 16, an optical confinement layer 52 is formed. The grating is composed of the periodic corrugation formed on the surface of the cladding layer 16 and the optical confinement layer 52 formed on the cladding layer 16. The semiconductor layer portion 20 is formed on the optical confinement layer 52, and an optical confinement layer 54 made of the same material as that of the optical confinement layer 52 is formed on the semiconductor layer portion 20. Alternatively, a periodic corrugation may be formed directly on a semiconductor substrate 12, and an optical confinement layer 52 may then be formed thereon. In this case, the periodic corrugation formed on the semiconductor substrate 12 and the optical confinement layer 52 formed on the semiconductor substrate 12 constitute a grating.

In the description of the structure of the semiconductor laser 10, the case where an InP substrate is used as the semiconductor substrate 12 has been described. Alternatively, a substrate made of, for example, GaAs may be used. In such a case, the materials of other layers are appropriately selected in accordance with the material of the semiconductor substrate 12. For example, when the semiconductor substrate 12 is made of GaAs, a first active layer 20A and a second active layer 20B may be made of AlGaAs, and a wavelength-tuning layer (intermediate layer) 20C may be made of GaAs.

The principle of the present invention has been described in the preferred embodiments with reference to the drawings. It is to be understood by those skilled in the art that the present invention can be changed in the arrangement and in the details without departing from the principle. The present invention is not limited to the specific structures disclosed in the embodiments. Accordingly, all modifications and changes derived from the scope of Claims and the spirit thereof are claimed.

What is claimed is:

1. A distributed feedback semiconductor laser in which the lasing wavelength can be changed, comprising:

a semiconductor substrate;

a semiconductor layer portion provided on the semiconductor substrate and including a first active layer having a first bandgap energy, a second active layer having a second bandgap energy, and an intermediate layer having a third bandgap energy, the intermediate layer optically coupling the first active layer and the second active layer, the first active layer, the intermediate layer, and the second active layer being arranged in that order in a predetermined axis direction;

a diffraction grating having a period, the diffraction grating being optically coupled with the first active layer and the second active layer of the semiconductor layer portion;

a first electrode for injecting carriers into the first active layer;

a second electrode for injecting carriers into the second active layer; and a third electrode for supplying the intermediate layer with a signal for wavelength tuning, wherein the diffraction grating extends in the predetermined axis direction, the period of the diffraction grating is uniform in the predetermined axis direction, and the third bandgap energy of the intermediate layer is larger than the first bandgap energy of the first active layer and the second bandgap energy of the second active layer.

2. The semiconductor laser according to claim 1, wherein the first active layer and the second active layer are made of the same semiconductor material.

3. The semiconductor laser according to claim 1, wherein the diffraction grating is provided on the semiconductor layer portion.

4. The semiconductor laser according to claim 1, wherein the diffraction grating is provided on the semiconductor substrate, and the semiconductor layer portion is provided on the diffraction grating.

5. The semiconductor laser according to claim 1, wherein the diffraction grating has a coupling coefficient of 100 cm$^{-1}$ or more.

6. The semiconductor laser according to claim 1, wherein the third electrode is disposed in a central portion of the semiconductor laser in the predetermined axis direction.

7. The semiconductor laser according to claim 1, wherein the third electrode has a length in the predetermined axis direction which is 1/10 or less of a length of the semiconductor laser in the predetermined axis direction.

8. The semiconductor laser according to claim 1, wherein the diffraction grating includes a periodic corrugation provided at an interface between an optical confinement layer provided on the semiconductor layer portion and a cladding layer provided on the optical confinement layer, and
the optical confinement layer is made of a semiconductor material having a bandgap energy larger than the first bandgap energy of the first active layer and the second bandgap energy of the second active layer.

9. The semiconductor laser according to claim 4, wherein the diffraction grating includes a periodic corrugation provided at an interface between the semiconductor substrate and an optical confinement layer provided on the semiconductor substrate, and
the optical confinement layer is made of a semiconductor material having a bandgap energy larger than the first bandgap energy of the first active layer and the second bandgap energy of the second active layer.

10. An optical integrated semiconductor device comprising:
a plurality of semiconductor lasers;
a semiconductor optical combining portion that is optically coupled with the semiconductor lasers and that combines laser beams output from the semiconductor lasers to output a combined laser beam; and
a semiconductor optical amplifier portion that is optically coupled with the semiconductor optical combining portion and that optically amplifies the combined laser beam output from the semiconductor optical combining portion to output an amplified laser beam,
each of the semiconductor lasers being a distributed feedback semiconductor laser in which the lasing wavelength can be changed, and each including:
a semiconductor substrate,
a semiconductor layer portion provided on the semiconductor substrate and including a first active layer having a first bandgap energy, a second active layer having a second bandgap energy, and an intermediate layer having a third bandgap energy, the intermediate layer optically coupling the first active layer and the second active layer, the first active layer, the intermediate layer, and the second active layer being arranged in that order in a predetermined axis direction,
a diffraction grating having a period, the diffraction grating being optically coupled with the first active layer and the second active layer of the semiconductor layer portion,
a first electrode for injecting carriers into the first active layer,
a second electrode for injecting carriers into the second active layer, and
a third electrode for supplying the intermediate layer with a signal for wavelength tuning, wherein
the diffraction grating extends in the predetermined axis direction,
the period of the diffraction grating is uniform in the predetermined axis direction,
the third bandgap energy of the intermediate layer is larger than the first bandgap energy of the first active layer and the second bandgap energy of the second active layer,
the periods of the diffraction gratings of the semiconductor lasers are different from each other,
the semiconductor lasers are provided with a common substrate, and
the semiconductor optical combining portion and the semiconductor optical amplifier portion are provided on the substrate.

11. A distributed feedback semiconductor laser in which the lasing wavelength can be changed, comprising:
a semiconductor substrate;
a semiconductor substrate layer portion provided on the semiconductor substrate and including a first active layer, a second active layer, an intermediate layer that optically couples the first active layer and the second active layer, the first active layer, the intermediate layer, and the second active layer being arranged in that order in a predetermined axis direction;
a diffraction grating having a period, the diffraction grating being optically coupled with the first active layer and the second active layer of the semiconductor layer portion;
a first electrode for injecting carriers into the first active layer;
a second electrode for injecting carriers into the second active layer; and
a third electrode for supplying the intermediate layer with a signal for wavelength tuning, wherein
the diffraction grating extends in the predetermined axis direction,
the period of the diffraction grating is uniform in the predetermined axis direction, and
the third electrode has a length in the predetermined axis direction which is 1/10 or less of a length of the semiconductor laser in the predetermined axis direction.

* * * * *